United States Patent
Henry et al.

(10) Patent No.: US 6,798,064 B1
(45) Date of Patent: Sep. 28, 2004

(54) ELECTRONIC COMPONENT AND METHOD OF MANUFACTURE

(75) Inventors: Haldane S. Henry, Glendale, AZ (US); Darrell G. Hill, Tempe, AZ (US); Colby G. Rampley, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 321 days.

(21) Appl. No.: 09/614,794

(22) Filed: Jul. 12, 2000

(51) Int. Cl.⁷ .................... H01L 23/48; H01L 23/52
(52) U.S. Cl. ............................. 257/750; 257/751
(58) Field of Search .................. 257/750, 751, 257/752–760

(56) References Cited

U.S. PATENT DOCUMENTS

| | | | |
|---|---|---|---|
| 4,857,481 A | 8/1989 | Tam et al. | 437/182 |
| 4,916,520 A | 4/1990 | Kurashima | 357/71 |
| 5,219,713 A | 6/1993 | Robinson | |
| 5,408,742 A | 4/1995 | Zaidel et al. | 29/846 |
| 5,677,574 A | 10/1997 | Hisaka | 257/776 |
| 5,686,743 A | 11/1997 | Lammert | 257/276 |
| 5,817,446 A | 10/1998 | Lammert | |
| 6,037,245 A | 3/2000 | Matsuda | |
| 6,268,262 B1 * | 7/2001 | Loboda | 438/422 |
| 6,380,552 B2 * | 4/2002 | Schmitz et al. | 257/15 |

FOREIGN PATENT DOCUMENTS

| | | | | |
|---|---|---|---|---|
| EP | 0501407 A | 9/1992 | | |
| EP | 0 501 407 A1 * | 9/1992 | ......... | H01L/23/522 |
| EP | 0693778 A2 | 1/1996 | | |
| JP | 01245530 | 9/1889 | | |
| JP | 01262646 | 10/1889 | | |

* cited by examiner

Primary Examiner—Eddie Lee
Assistant Examiner—Douglas W. Owens
(74) Attorney, Agent, or Firm—Kim-Marie Vo

(57) ABSTRACT

An electronic component includes a substrate (110) and an airbridge (890) located over the substrate. The airbridge has at least a first layer and a second layer over the first layer. The airbridge is electrically conductive where the first layer of the airbridge is less resistive than the second layer of the airbridge.

16 Claims, 3 Drawing Sheets

ELECTRONIC COMPONENT AND METHOD OF MANUFACTURE

FIELD OF THE INVENTION

This invention relates, in general, to electronics, and more particularly, to electronic components having airbridges and methods of manufacturing electronic components having airbridges.

BACKGROUND OF THE INVENTION

Airbridges are used in electronic components to increase their interconnect speed. Airbridges provide higher interconnect speed because air is used as the interlayer dielectric between adjacent interconnect layers. Air has a lower dielectric constant than conventional interlayer dielectrics such as silicon dioxide and silicon nitride. The lower dielectric constant decreases the parasitic capacitance between adjacent interconnect layers, and the lower parasitic capacitance enables the higher interconnect speed.

Airbridges are typically made of gold to provide low electrical resistance, but gold is a soft material. The soft, exposed gold of the airbridges is often damaged during semiconductor wafer processing, assembly, and packaging in an automated manufacturing process. The damaged airbridges reduce the manufacturing yields for the electronic components.

To improve the manufacturing yields, special handling and manually intensive processes can be used to manufacture the electronic components. However, these special techniques are slow and expensive.

Accordingly, a need exists for a method of manufacturing an electronic component with an airbridge that is compatible with an automated manufacturing process and that has high manufacturing yields. A need also exists for an electronic component with an airbridge that is manufacturable, robust, and reliable.

BRIEF DESCRIPTION OF THE DRAWINGS

The invention will be better understood from a reading of the following detailed description, taken in conjunction with the accompanying drawing figures in which.

Figure 1:
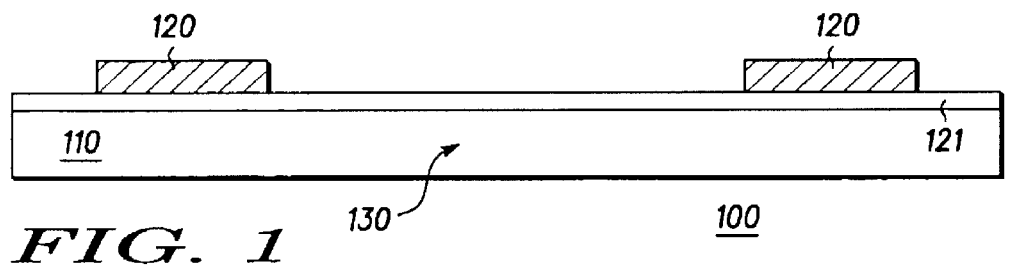
FIGS. 1 through 8 illustrate cross-sectional views of a portion of an electronic component after different manufacturing steps in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same or similar elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than those described or illustrated herein.

Moreover, the terms front, back, top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than those described or illustrated herein.

DETAILED DESCRIPTION OF THE DRAWINGS

FIGS. 1 through 8 illustrate cross-sectional views of a portion of an electronic component 100 after different manufacturing steps. Electronic component 100 comprises a substrate and an airbridge located over the substrate. The airbridge has at least a first layer and a second layer over the first layer. The airbridge is electrically conductive, and the first layer of the airbridge is less resistive than the second layer of the airbridge. The second layer of the airbridge can be electrically conductive or electrically insulative. In the preferred embodiment, the airbridge is comprised of three layers: a thin, stiff, electrically conductive barrier layer at the bottom; a thick, soft, electrically conductive layer in the middle; and a thick, hard, electrically insulative, passivating layer at the top. As an example, the airbridge can have a design width of approximately 3 to 300 micrometers and a design length of approximately 3 to 30 micrometers. The design length is the distance between landings supporting the airbridge.

As illustrated in FIG. 1, electronic component 100 includes a substrate 110, portions 120 of an electrically conductive layer, and an optional semiconductor device 130. In the preferred embodiment, substrate 110 is a semiconductor substrate and can include electrically conductive and electrically insulative layers. In another embodiment, substrate 110 can be comprised of a multi-layered Personal Computer Board (PCB).

Optional semiconductor device 130 is formed to be located at least partially within or supported by substrate 110. As an example, device 130 can be a Complementary Metal-Oxide-Semiconductor (CMOS) integrated circuit, a bipolar integrated circuit, or a Bipolar CMOS (BiCMOS) integrated circuit.

After forming device 130 and any desired electronically conductive and/or insulative layers, an electrically conductive layer can be formed over substrate 110 and device 130. As an example, the electrically conductive layer can be an ohmic metal or an interconnect metal. Next, an optional insulative layer (not shown in FIG. 1) can be formed over the electrically conductive layer. Holes can be formed in the optional electrically insulative layer to expose portions 120 of the electrically conductive layer. Portions 120 of the electrically conductive layer can be electrically coupled to semiconductor device 130. In a different embodiment, the electrically conductive layer can be formed after the formation of the optional electrically insulative layer 121 as shown in the resulting structure in FIG. 1.

Figure 2:
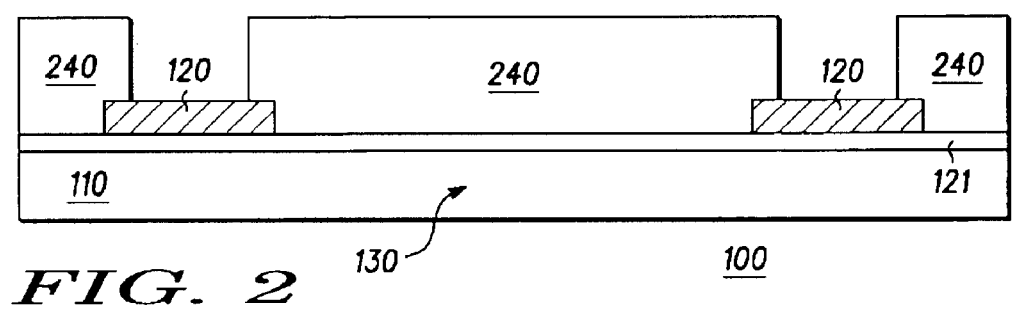

As illustrated in FIG. 2, a sacrificial layer 240 is formed over a portion of substrate 110 and device 130. As an example, sacrificial layer 240 can be a positive or negative photoresist material. The thickness of sacrificial layer 240 is preferably greater than the thickness of a subsequently deposited metal layer. As an example, the photoresist can be coated to a thickness of approximately 3.5 micrometers. Next, the photoresist can be soft-baked, and then, the photoresist can be exposed to actinic radiation to define a pattern within the photoresist. Subsequently, the photoresist is developed to produce the profile of sacrificial layer 240 illustrated in FIG. 2.

Figure 3:
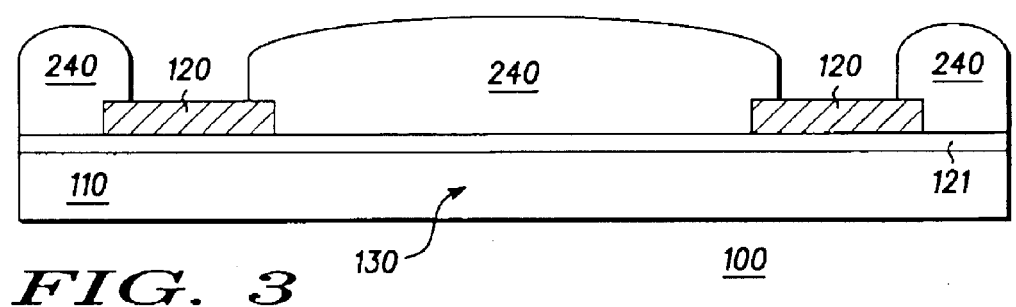

FIG. 3 illustrates sacrificial layer 240 after a reflow process and a baking process. After developing the photoresist, the photoresist is reflowed to round or smooth the edges of sacrificial layer 240. The rounded or smoothed profile of sacrificial layer 240 enables the subsequent formation of a more reliable airbridge. This reflow process can include ramping a reflow temperature from a first temperature up to a second temperature during a first period of time, and heating sacrificial layer 240 from the first temperature up to the second temperature during the first period of time. The reflow process can continue by reflowing sacrificial layer 240 at the second temperature during a second period of time after the first period of time. As an example, the photoresist can be heated from approximately 100 degrees Celsius to approximately 130 degrees Celsius within approximately 30 seconds, and then the photoresist can be mediately reflowed at approximately 130 degrees Celsius for approximately 60 seconds. In the preferred embodiment, this reflow process does not use or avoids using Deep Ultra-Violet (DUV) radiation or light.

Next, sacrificial layer 240 is baked to harden sacrificial layer 240 in its new shape. The baking process also prevents the photoresist of sacrificial layer 240 from undesirably reticulating during a subsequent metal layer deposition. This baking process can include ramping a baking temperature from a third temperature up to a fourth temperature during a third period of time, and heating sacrificial layer 240 from the third temperature up to the fourth temperature during the third period of time. The baking process can continue by baking sacrificial layer 240 at the fourth temperature during a fourth period of time. In the preferred embodiment, the third temperature of the baking process is equal to the second temperature of the reflow process. As an example, the photoresist can be heated from approximately 130 degrees Celsius to approximately 150 degrees Celsius within approximately 30 seconds, and then the photoresist can be immediately baked at approximately 150 degrees Celsius for approximately 180 seconds. In the preferred embodiment, the baking process does not use or avoids using DUV radiation or light.

Figure 4:
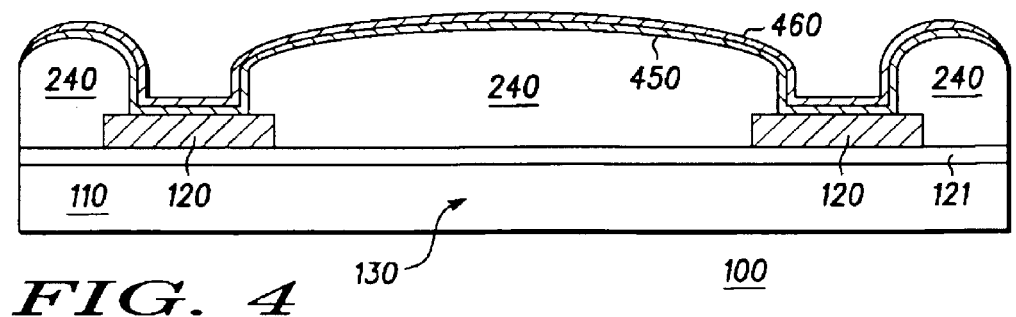

Turning to FIG. 4, a layer 460 and a layer 450 located underneath layer 460 are formed over sacrificial layer 240, substrate 110, and device 130 to form a portion of an airbridge. Layer 450 is preferably an electrically conductive barrier layer, and layer 460 is preferably an electrically conductive seed layer. Also in the preferred embodiment, layer 450 is more resistive than layer 460, and layer 450 is more stiff or rigid than layer 460.

As an example, layer 450 can be sputter deposited to a thickness of approximately 100 to 200 nanometers. In the preferred embodiment, a sputter etch is not performed before sputter depositing layer 450. The thickness of layer 450 is preferably at least 100 to 120 nanometers to provide sufficient current flow during a subsequent deplating process. Also in the preferred embodiment, layer 450 has a thickness of approximately 150 nanometers. As an example, layer 450 can be comprised of titanium, titanium tungsten, titanium tungsten nitride, or any combination of such layers.

Layer 460 can be sputter deposited over layer 450 to a thickness of approximately 50 to 200 nanometers. Layer 460 preferably has a thickness of at least 50 to 60 nanometers to provide an adequate seed thickness for a subsequent plating process. As an example, layer 460 can be comprised of gold. In the preferred embodiment, the depositions of layers 450 and 460 are preferably performed below the reflow and bake temperatures described previously for sacrificial layer 240.

Figure 5:
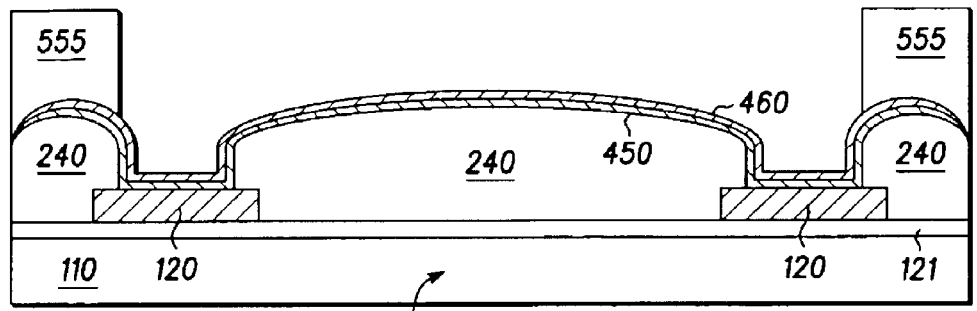

Next, in FIG. 5, a plating mask 555 is formed over layers 450 and 460. Mask 555 exposes a portion of layer 460 to define a plating area. Mask 555 has a thickness greater than a thickness of the metal layer to be plated. As an example, mask 555 can have a thickness of approximately 3.5 nanometers. Mask 555 can be formed by coating a layer of photoresist over layers 450 and 460, soft-baking the photoresist, exposing the photoresist to a pattern of actinic radiation, and developing the photoresist. In the preferred embodiment, mask 555 is not exposed to DUV radiation or light. Additionally, mask 555 is preferably not exposed to a baking process between the exposure and developing steps, and mask 555 is also preferably not exposed to a hard-bake or curing process after the developing step. After forming mask 555, the exposed portion of layer 460 is cleaned.

Figure 6:
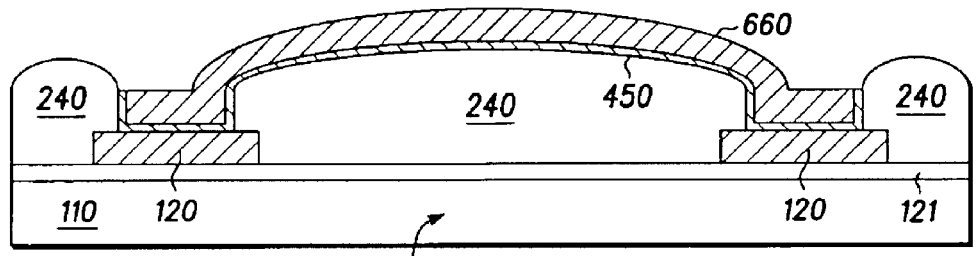

As illustrated in FIG. 6, an electrically conductive layer 660 is plated over layer 450. As an example, layer 660 can be plated to a thickness of approximately 2.6 micrometers. The plating of layer 660 forms another portion of the airbridge. Layer 660 preferably has a width greater than the design width described earlier. Layer 660 includes layer 460 of FIG. 5. Accordingly, layer 660 in FIG. 6 is comprised of the same material as layer 460 of FIG. 5.

After the plating of layer 660, mask 555 (FIG. 5) is removed. Next, the exposed portions of layer 460 (FIG. 5) are deplated, and then the exposed portions of layer 450 are etched away. In the preferred embodiment, the etching of layer 450 is preferably performed using a timed etch and not an endpointed etch because of the difficulties of detecting the etch endpoint. Also in the preferred embodiment, the etching of layer 450 is performed using a dry etching process and not a wet etching process to minimize the undercutting of layer 450.

Figure 7:
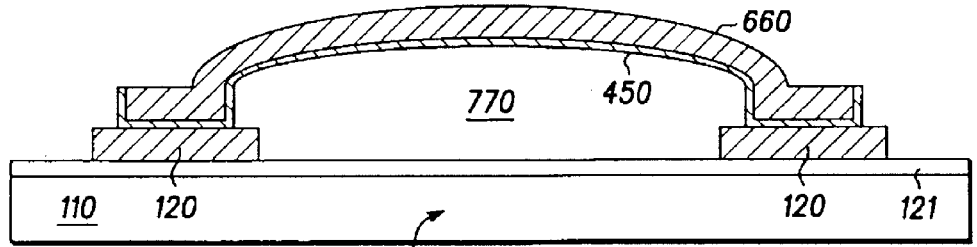

Turning to FIG. 7, the sacrificial layer is removed to form a gap 770 underneath layers 660 and 450 and between layer 450 and substrate 110. As an example, the sacrificial layer can be removed using a Kwik Strip chemical, commercially available from AZ Clariant of Sunnyvale, Calif. As an example, the sacrificial layer can be removed by being soaked in the Kwik Strip chemical for approximately 30 minutes at a temperature of approximately 90 degrees Celsius. In another embodiment, acetone can be used to remove the sacrificial layer. In the preferred embodiment, the sacrificial layer is removed after plating layer 660 and before forming a subsequent portion of the airbridge.

Figure 8:
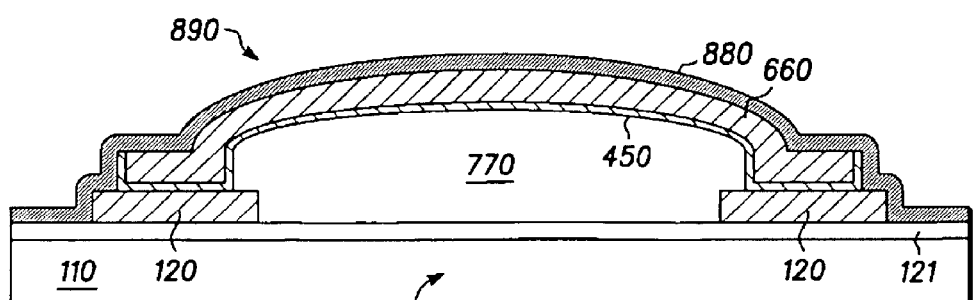

Next, in FIG. 8, electronic component 100 is illustrated to include a layer 880, which forms another portion of the airbridge. The airbridge is identified by element number 890 in FIG. 8. In the preferred embodiment, layer 880 is a passivation layer that prevents scratches and other defects in the underlying, softer layer 660 during subsequent processing, assembly, packaging, and handling of electronic component 100. Accordingly, layer 880 is harder than layer 660. Layer 880 also strengthens the airbridge. Accordingly, layer 880 is stiffer than layer 660. As an example, layer 880 can be comprised of an electrically insulative material such as polyimide, silicon dioxide, silicon nitride, silicon oxynitride, or Tetra-Ethyl-Ortho-Silicate (TEOS). Accordingly, layer 880 is preferably more resistive than layers 450 and 660. In an alternative embodiment, layer 880 can be electrically conductive.

Layer 880 has a thickness that is less than a combined thickness of layers 450 and 460 and gap 770. The thickness of gap 770 is the height of gap 770 or the distance between layer 450 and the top surface of substrate 110 in FIG. 8. In the preferred embodiment, layer 880 has a thickness that is less than approximately fifty percent of the combined thickness of layers 450 and 660 and gap 770 or the combined thickness of only layer 660 and gap 770. As, an example, layer 880 can have a thickness of approximately 800 nanometers. The small thickness of layer 880 prevents layer 880 from sealing gap 770. In the preferred embodiment, gap 770 is not even partially sealed by layer 880.

Layer 880 is preferably deposited using a Chemical Vapor Deposition (CVD) process operated at a low temperature, below approximately 350 degrees Celsius, and at a reduced pressure, below approximately 1.5 Torr. These deposition parameters give layer 880 a fairly low compressive stress level of approximately 0 to 200 MegaPascals (MPa), which strengthens the airbridge. On average, layer 800 has a compressive stress level of approximately 100 MPa.

The CVD process also preferably deposits layer 880 in a substantially vertical and substantially conformal manner. The vertical nature of the deposition prevents layer 880 from being formed under a center or central portion of the width of the airbridge where the central portion of the width of the airbridge forms the aforementioned design width of the airbridge. Therefore, in the preferred embodiment, the design width portion of the airbridge does not overlap any of the portion of layer 880 located underneath the airbridge. However, portions of layer 880 may be located underneath peripheral edges of the airbridge, but a significant portion of the airbridge preferably does not overlap the portion of layer 880 located underneath the airbridge. As an example, an overlap of approximately 3% to 10% of the actual airbridge width can overlap the portions of layer 880 located underneath the airbridge.

Next, an etch mask (not shown in FIG. 8) is formed over layer 880. In the preferred embodiment, the etch mask is comprised of positive, not negative, photoresist to directly protect portions of layer 880, the sides of layers 660 and 450, and the portion of the top surface of substrate 110 located underneath the airbridge. As an example, the etch mask can have a thickness of approximately 3.5 micrometers. The photoresist of the etch mask can be coated over layer 880, soft-baked using a ramped baking temperature, exposed to a pattern of actinic radiation, and developed. In the preferred embodiment, the photoresist is not exposed to DUV radiation or light and is also not baked or cured after being exposed or developed.

The soft-bake process occurs over a range of temperatures in ambient or a higher pressure. For example, the photoresist can be heated over a range of temperatures during a fifth time period. As an example, electronic component 100 can be lowered to approximately 1 millimeter above a heating surface that is heated to a temperature of approximately 120 degrees Celsius. Then, over approximately 90 seconds, electronic component 100 can be lowered at a linear rate to contact the heating surface. Immediately afterwards, electronic component 100 can be baked for approximately 5 seconds while contacting the heating surface, which remains heated to 120 degrees Celsius.

Next, the exposed portions of layer 880 are etched to expose underlying bond pads. Then, the etch mask is removed, and substrate 110 can be thinned. The thinning process can include mounting electronic component 100 upside down on a support wafer comprised of sapphire, mechanically grinding the back surface of substrate 110, wet and dry etching the back surface of substrate 110, and demounting electronic component 100 from the support wafer. Next, substrate 110 can be sawn to singulate electronic component 100 from other electronic components formed in or over substrate 110. Then, electronic component 100 can be picked and placed onto a lead frame for assembly and packaging. During the packaging process, gap 770 underneath the airbridge can be filled with air or another gas.

Figure 9:
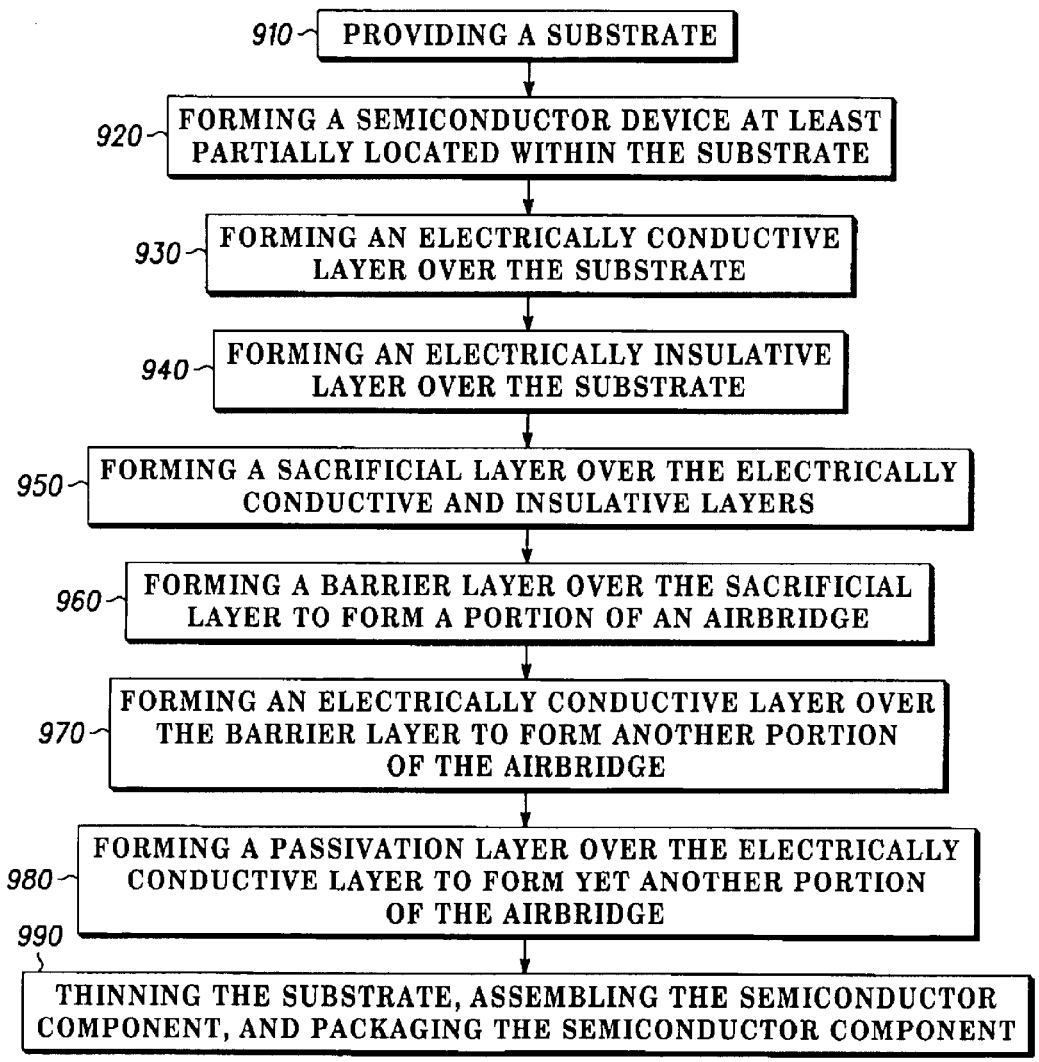
FIG. 9 illustrates a flow chart of a method of manufacturing the electronic component in accordance with an embodiment of the invention.

FIG. 9 illustrates a flow chart of the method of manufacturing electronic component 100 described previously with reference to FIGS. 1 through 8. At a step 910 of method of 900, a substrate is provided, and at a step 920 of method 900, a semiconductor device is formed at least partially located within the substrate. Next, at a step 930, an electrically conductive layer is formed over the substrate, and at a step 940, an electrically insulative layer is formed over the substrate. Then, at a step 950 of method 900, a sacrificial layer is formed over the electrically insulative and conductive layers. In the preferred embodiment, step 950 includes the ramped temperature reflow and baking processes described earlier. Subsequently, at a step 960 of method 900, an electrically conductive barrier layer is formed over the sacrificial layer to form a portion of an airbridge. In the preferred embodiment, step 960 includes the sputter deposition and subsequent patterning of the barrier layer. Then, at a step 970 of method 900, an electrically conductive layer is formed over the barrier layer to form another portion of the airbridge. In the preferred embodiment, step 970 includes the sputter deposition of a seed layer, the plating of the plated layer, and the subsequent patterning or deplating of the seed layer. Next, at a step 980 of method 900, a passivation layer is formed over the electrically conductive layer to form yet another portion of the airbridge. In the preferred embodiment, step 980 includes the deposition of the passivation layer and the subsequent patterning of the passivation layer. The patterning of the passivation layer includes the ramped temperature soft-baking of the photoresist used to define the pattern in the passivation layer. Then, at a step 990, the substrate is thinned, assembled, and packaged into a semiconductor or electronic component.

Therefore, an improved electronic component and method of manufacture is provided to overcome the disadvantages of the prior art. In fact, the method of manufacturing electronic component 100 described in FIGS. 1 through 8 provides many non-obvious advantages. For example, the use of layer 880 (FIG. 8) as part of the airbridge protects the airbridge during the processing steps occurring after formation of the airbridge. Also, layer 880 preferably has a low stress level to minimize any problems associated with a mismatch between the coefficients of thermal expansion between layers 660 and 880 (FIG. 8). Additionally, layer 880 is preferably not located underneath a substantial portion of the airbridge to minimize the parasitic capacitance between the airbridge and underlying interconnect layers. Furthermore, the ramped temperature for the soft-baking of the etch mask over layer 880 improves the manufacturing yield for electronic component 100. Moreover, the elimination of the post-exposure bake and the post-develop bake for the etch mask located over layer 880 also improves the manufacturing yield for electronic component 100. The electrical testing of the electronic component described herein has demonstrated the reliability and robustness of the airbridges.

Although the invention has been described with reference to specific embodiments, it will be understood by those skilled in the art that various changes may be made without departing from the spirit or scope of the invention. For instance, the numerous details set forth herein such as, for example, the material compositions and layer thicknesses are provided to facilitate the understanding of the invention and are not provided to limit the scope of the invention. Furthermore, the manufacturing steps of the metal portions of the airbridge are not limited to sputtering and plating, but can also include evaporating or any other known techniques. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. An electronic component comprising:

a substrate; and an airbridge located over the substrate and having at least a first layer and a second layer, wherein a first portion of the second layer is over the first layer, wherein:

a gap exists between a portion of the airbridge and the substrate; and a thickness of the second layer is less than a combined thickness of the first layer and the gap;

the airbridge is electrically conductive; and the first layer of the airbridge is less resistive than the second layer of the airbridge.

2. The electronic component of claim 1 wherein:

the second layer is a passivation layer.

3. The electronic component of claim 1 wherein:

the second layer is harder than the first layer.

4. The electronic component of claim 1 wherein:

the thickness of the second layer is less than fifty percent of the combined thickness of the first layer and the gap.

5. The electronic component of claim 1 wherein:

a second portion of the second layer is located underneath an edge of the first layer.

6. The electronic component of claim 1 wherein:

the second layer is absent underneath a center portion of a width of the airbridge.

7. The electronic component of claim 1 wherein:

a gap exists underneath a portion of the airbridge; and the gap is unsealed underneath the portion of the airbridge.

8. The electronic component of claim 1 wherein:

the second layer of the airbridge has a compressive stress level of approximately 0 to 200 MegaPascals.

9. The electronic component of claim 1 wherein:

the bridge further comprises:

a third layer underneath the first layer; and the third layer is more resistive than the first layer.

10. The electronic component of claim 9 wherein:

the second layer is more resistive than the third layer.

11. The electronic component of claim 1 wherein:

the second layer of the airbridge is electrically conductive.

12. The electronic component of claim 1 wherein:

the second layer of the airbridge is electrically insulative.

13. A semiconductor component comprising:

a semiconductor substrate;

a semiconductor device supported by the semiconductor substrate;

a first electrically insulative layer overlying the semiconductor substrate and the semiconductor device; and an airbridge located over the semiconductor substrate, located over the first electrically insulative layer, and electrically coupled to the semiconductor device, wherein:

a gap exists between a portion of the airbridge and the first electrically insulative layer;

the airbridge has a first electrically conductive layer;

the airbridge has a second electrically insulative layer overlying the first electrically conductive layer; and the second electrically insulative layer is a passivation layer harder than the first electrically conductive layer; and the airbridge further comprises;

an electrically conductive barrier layer located underneath the first electrically conductive layer and more resistive than the first electrically conductive layer.

14. The semiconductor component of claim 13 wherein:

a thickness of the second electrically insulative layer is less than fifty percent of a combined thickness of the electrically conductive barrier layer, the first electrically conductive layer, and the gap.

15. The semiconductor component of claim 13 wherein:

the second electrically insulative layer is devoid of sealing the gap underneath the portion of the airbridge.

16. A method of manufacturing an electronic component comprising:

providing a substrate;

forming an electrically insulative layer over the substrate;

forming a first layer over the first electrically insulative layer to form a first portion of an airbridge;

forming a first portion of a second layer over the first layer to form a second portion of the airbridge over the substrate;

forming a gap between the airbridge and the electrically insulative layer; and designing the airbridges to have a design width, wherein;

the airbridge is electrically conductive;

the first layer of the airbridge is less resistive than the second layer of the airbridge; and forming the first layer further comprises:

forming the first layer to have a first layer width greater than the design width; and forming the second layer further comprises:

forming a second portion of the second layer underneath edges of the first layer; and keeping the second layer absent underneath a central portion of the first layer, the central portion of the first layer having the design width.

* * * * *